United States Patent [19]

Eguchi

[11] Patent Number: 5,278,780
[45] Date of Patent: Jan. 11, 1994

[54] SYSTEM USING PLURALITY OF ADAPTIVE DIGITAL FILTERS

[75] Inventor: Masaki Eguchi, Nara, Japan

[73] Assignee: Sharp Kabushiki Kaisha, Osaka, Japan

[21] Appl. No.: 911,026

[22] Filed: Jul. 9, 1992

[30] Foreign Application Priority Data

Jul. 10, 1991 [JP] Japan ................... 3-169545
Feb. 21, 1992 [JP] Japan ................... 4-33783

[51] Int. Cl.$^5$ .................... G06F 15/31; G10K 11/16
[52] U.S. Cl. ........................... 364/724.19; 381/71
[58] Field of Search ............. 364/724.19, 724.20, 364/724.16, 724.12, 724.01; 381/71, 94

[56] References Cited

U.S. PATENT DOCUMENTS 4,038,536  7/1977  Feintuch ................ 364/724.19
5,018,202  5/1991  Takahashi et al. ............. 381/71

OTHER PUBLICATIONS

"The Method of Active Noise Control with Adaptive Restraint of Howling", the 250th Lecture Meeting of Kansi-branch, Nov. 16, 1991, pp. 191-192.
"Active Noise Control Chair", Electronics Information/Communication Society, Electronics Audio Session Report 1990, pp. 7-14.
"Broadband Active Sound Control System for Air-Conditioning Duct Noise Using Adaptive Digital Filter", Electronics Information/Communication Society/Technical Report vol. 88, No. 105, 1988, pp. 49-54.
"Acoustic Noise Suppression Using Regressive Adaptive Filtering" to R. A. Goubran et al., 40th Vehicular Technology Conf., May 6-9, Orlando, Fla.
"Selection Of A Spatial Processor For A Very Low Frequency Receiver" to J. W. Bond, Proc IEEE-/AIAA 7th Dig. Avoinics Systems Conf., Oct. 13-16, 1986, Washington, D.C.
"Active Noise Reduction Using A Neutral Network Processing System", to P. H. J. Koers et al, Intern. Neutral Network Conference, Jul. 9-13, 1990, Paris, France.

Primary Examiner—Long T. Nguyen

[57] ABSTRACT

A main adaptive digital filter and a sub adaptive digital filter are provided, and these two adaptive digital filters share a filter coefficient to be controlled. On the side of the main adaptive digital filter, the shared coefficient is updated so that the difference between the output and a desired response is minimized and on the side of the subadapted digital filter, the above-stated shared filter coefficient is updated so that the output is minimized. A prescribed limitation is given to the frequency characteristic of a filter coefficient to be adapted, by treating the input of the sub adaptive digital filter as a signal weighted on the frequency or a noise having its band limited with respect to the input signal or the output signal of the main adaptive digital filter, and coefficient updating control is conducted so that the coefficient will not go beyond the limitation.

10 Claims, 13 Drawing Sheets

FREQUENCY CHARACTERISTIC
OF FILTER

FREQUENCY CHARACTERISTIC
OF COEFFICENT SEQUENCE
UPDATED BY CONVENTIONAL
ADAPTIVE DIGITAL FILTER (A)

(B)

EXPERIMENT SYSTEM

SPECIFICATION OF THE CONTROLLER

| SAMPLING FREQUENCY | | 5.5 [kHz] |
|---|---|---|
| AD - CONVERTER | | 12 BITS ± 1/2 LSB |
| DA - CONVERTER | | 12 BITS ± 1/2 LSB |
| ANTI-ALIASING FILTER | | 5TH DEGREE CHEBYSHEV (fc = 2kHz) |
| THE NUMBER OF FILTER TAPS | | |
| | ADAPTIVE FIR | 128 [TAPS] |
| | FIR (BLOCK A) | 128 [TAPS] |
| | FIR (BLOCK B) | 69 [TAPS] |

POWER SPECTRUM OF NOISE

FREQUENCY CHARACTERISTIC
OF FILTER

BASIC CONSTRUCTION OF ACTIVE
NOISE SILENCING APPARATUS (a)

(b)

(c)

(d)

SYSTEM USING PLURALITY OF ADAPTIVE DIGITAL FILTERS

BACKGROUND OF THE INVENTION

1. Field of the Invention

The present invention relates generally to systems using adaptive digital filters, and more specifically, to an adaptive digital filter system used for a signal control circuit in an active noise cancellation apparatus, a signal control circuit in an active vibration control apparatus, an adaptive equivalent equipment in a communication apparatus, an echo canceler, a noise canceler, an adaptive line spectrum enhancer used in various digital signal processings.

2. Description of the Related Art

A Finite Impulse Response digital filter (hereinafter referred to as FIR digital filter) having a coefficient sequence which is variable and conveniently controlled is called an adaptive digital filter, and the adaptive digital filter is formed of an FIR digital filter portion and a coefficient control portion.

FIG. 10 is a diagram showing a representative construction of an adaptive digital filter. Referring to FIG. 10, the adaptive digital filter includes a unit delay element 18, a multiplier 19 having a coefficient sequence $h(i)$ to form filter coefficients and an adder 20, and a coefficient control portion 21 controlling the coefficient sequence $h(i)$.

When input into the adaptive digital filter, a signal $u(n)$ is subjected to conversion based on the following equation (1) in the FIR digital filter and a signal $y(n)$ is output. N represents the number of taps in the digital filter.

$$y(n) = \sum_{i=0}^{N-1} h(i)u(n-i) \qquad (1)$$

The above coefficient sequence $h(i)$ is updated by coefficient control portion 21, and the output signal $y(n)$ changes appropriately to be a desired signal. There are various algorithms for coefficient control portion 21 to control the coefficients, and a typical one is an LMS (Least Mean Square) algorithm by which coefficients are controlled based on the following equation (2):

$$h(i,n+1) = h(i,n) + \alpha u(n-i)e(n) \qquad (2)$$

, where $e(n)$ represents an error, i.e. the difference $d(n) - y(n)$ between a desired signal $d(n)$ and the output signal $y(n)$, and $\alpha$ represents a convergence coefficient. $\alpha$ usually takes a small positive value to prevent its divergence. According to the algorithm, the coefficient sequence $h(i)$ continues to be updated until an error signal $e(n)$ becomes 0, and a desired signal corresponding to an input signal is consequently output from the adaptive digital filter.

FIG. 11 is an illustration of a construction of the above described adaptive digital filter applied to a signal processing portion in an active noise cancellation apparatus which suppresses noise by emitting from a speaker for noise silencing 5 a sound wave 180° out of phase from and having the same amplitude as the noise from a noise source, thereby causing sound wave interference. The adaptive digital filter includes an FIR digital filter 6, a coefficient control portion 8, and a digital filter 7 for delay correction and gain correction of a signal from the output portion of FIR digital filter 6 to the input portion of coefficient control portion 8.

In the apparatus, a noise emitted from a noise source 1 is detected by a noise detecting microphone 3 and becomes an input signal $u(n)$. The input signal $u(n)$ is input into FIR digital filter 6, and subjected to a convolution operation based on the above equation (1) to be output as a noise silencing signal $y(n)$, and when the noise silencing signal is output to speaker for noise silencing 5, sound wave interference is effected by $y(n)$. Then, a result of the sound wave interference is detected at a noise silencing error detecting microphone 4, and the detected result is input as an error signal $e_0$ for the noise silencing into coefficient control portion 8 which operates based on the LMS algorithm. Herein, $-e_0$ corresponds to the difference $d(n) - y(n)$ between a desired signal $d(n)$ and the output signal $y(n)$ in the above equation (2), and the coefficient sequence $h(i)$ of FIR digital filter 6 is updated based on the following equation (3) similar to equation (2), so that an output from speaker for noise silencing 5 is adjusted to minimize the noise silencing error and the noise is canceled.

$$h(i,n+1) = h(i,n) - \alpha u_0(n-i) \, e_0(n) \qquad (3)$$

In the equation, $u_0(n)$ is a signal provided by addition of an amendment of a transfer characteristic from the output of FIR digital filter 6 to the output of noise silencing error detecting microphone 4 to the input signal $u(n)$. Herein, $h(i,n)$ represents a filter coefficient for a tap i at time n.

However, in the use of the above-described adaptive digital filter, when a signal having a frequency ½ or more as large as the sampling frequency fs of the adaptive digital filter is mixed into the input signal $u(n)$ or the error signal $e_0(n)$, a precision of noise silencing degrades due to phase errors in control, even increasing the noise in the frequency band, and sometimes howling results. More specifically, in active noise silencing, a noise is canceled by adding a sound of antiphase having the same amplitude as the noise, the effect of noise silencing is lost with 60° phase error even if complete control of the amplitudes is achieved, and the noise is increased with a phase error more than that. Further, as the frequency of the noise is higher, the number of samples with respect to a waveform of one cycle decreases and the precision of the additional sound degrades, and control is liable to be unstable especially to a frequency ½ or more as large as the sampling frequency fs. More specifically, a noise of a high frequency propagating in a high order mode in a duct 2 mode cannot be silenced effectively.

The sampling frequency fs indicates the following: an input/output value of the digital filter is produced to time-discrete data $u(n)$ as shown in equation (1). The $u(n)$ is sampled by an A/D converting circuit 15 at intervals of time T. The sampling frequency fs of the digital filter is given by:

$$fs = 1/T$$

Herein, the 0-order mode is a propagation mode in which a sound pressure is equalized (see FIG. 13(b)), when the sound pressure of a cross section A-B is inspected in a sound wave propagating a the duct (see FIG. 13(a)). The first order mode and the second order mode represent the cases with sound pressure waveforms as shown in FIGS. 13(c) and (d), respectively.

FIG. 14 is a representation showing the relation between the sound pressure waveform (a) of an actual noise and its sampled data (b). Referring to FIG. 14, when an actual signal is sampled at intervals of time T, values shown by dots are sampled as data. A waveform defined by a broken line is produced from the data shown by the dots, the amplitude and phase of the wave are both shifted from the original waveform, resulting in degradation in accuracy. Accordingly, howling is possibly encountered in the case of a frequency (½ sampling frequency) as shown in the figure.

The same problem will arise both in the case in which the transfer characteristic of digital filter 7 produced by previous measurement has a delay error, or in the case the characteristic itself has changed as speaker for noise silencing 5 or the like has changed with time.

With reference to FIG. 11, a description of the transfer characteristic of digital filter 7 is given. An output y of FIR digital filter 6 is transferred to speaker 5 via a D/A converting circuit 16 and an amplifier 13, and converted into a sound wave at speaker 5. Then, the sound wave is propagated in a duct 2, once again converted into an electrical signal at microphone 4, and input via an amplifier 14, and an A/D converting circuit 17 into a coefficient control portion (LMS circuit) 8 which controls filter coefficients. The term "transfer characteristic" herein means the relation between the output signal y of FIR digital filter 6 when noise source 1 does not emit sound and a signal appearing at the output of A/D converting circuit 17 through the above-stated path. The transfer characteristic is generally defined as a gain characteristic and a phase (delay) characteristic. Such transfer characteristic is provided to digital filter 7.

In other words, if the above-stated output signal y is input into digital filter 7, the characteristic of digital filter 7 is set so that the output of digital filter 7 is identical to the output of A/D converting circuit 17. The characteristic is decided based on data produced by previous measurement.

Assuming the filter coefficient of digital filter 7 is g(i) (where $i = 0 \sim M - 1$: M is a filter tap number (the number of filter coefficients)), the data $u_0(n)$ of digital filter 7 is given by the following equation:

$$u_0(n) = \sum_{i=0}^{M-1} g(i) u(n - i)$$

The filter coefficient g(i) defines the transfer characteristic of digital filter 7. The filter coefficient g(i) is produced by pervious measurement as described above.

Referring to FIG. 11, an error exists between the transfer characteristic of digital filter 7 which is produced by previous measurement and an actual transfer characteristic (D/A converting circuit 16→amplifier 13→speaker 5→duct 2→microphone 4→amplifier 14→A/D converting circuit 17), and the error causes an erroneous adjustment of the filter coefficient of FIR digital filter 6, resulting in howling. Among errors associated with transfer characteristics, the error in phase (delay) characteristic gives rise to a significant problem. When such a phase error is above 60°, the mean square value of $e_0$ cannot be minimized by updating the filter coefficient based on equation (3), and, conversely, the value is increased.

More specifically, as shown in FIGS. 15(A) and 15(B), a sound having a waveform of antiphase as shown at (b) is supposed to be output. However, if a waveform (d) out of phase from this waveform (b) is output, the amplitude of a waveform produced by addition of two waves (c+d) is increased with the phase error of 60° as a critical value. In other words, if a waveform having 60° or more out of phase with respect to the antiphase is added (see FIG. 15(B)), the amplitude increases, and if a waveform having 60° or more further out of phase from this is output for the purpose of adjusting this situation, the amplitude further increases, resulting in a howling phenomenon.

For the characteristic error of digital filter 7, the measurement error is considered to be primary. As for other causes, changes in the characteristics of speaker 5 and microphone 4 with time or change in the environment of duct 2, change in the speed of sound due to temperature changes, etc. cause differences between a previously measured transfer characteristic and an actual characteristic, sometimes resulting in howling. The effects brought about by such characteristic change is prominent for high frequency band. This is because if a delay uniformly changes by 100 μs at all the frequencies (for example, due to change in the speed of sound by temperature change), the 100 μs is translated into 18° in terms of phase at 500 Hz, while it corresponds to 72° at 2000 Hz. The situation may therefore be stable at 500 Hz, but at 2000 Hz there is a considerable possibility that howling takes place.

To cope with a high frequency signal, a method of increasing the sampling frequency fs is considered, but as the sampling frequency fs increases calculation cannot be finished within a sampling period, the timing of an output signal to an input signal is delayed, and effective control cannot be made. Connecting an analog filter for removing the high frequency component of a signal to a preceding stage to the input portion of the adaptive digital filter, but it takes a long period of time until the signal reaches the speaker since the delay time inherent to the analog filter is added to a signal processing period, and the size of the apparatus is increased in order to compensate for the time delay.

This problem due to the high frequency component mixing into the signal is also encountered when the adaptive digital filter is used for active vibration control. In vibration control, a controller is designed in a manner that the high order vibration modes of an object to be controlled is removed, but in that case, a phenomenon called spill over which causes oscillation in a removed higher order mode is sometimes effected. The cause for this spill over is the existence of a high order oscillation mode component mixed into a signal fed back to the controller. Similarly, when the above-described adaptive digital filter is used for the controller, precision degradation due to the high order mode component and instability in control are caused.

SUMMARY OF THE INVENTION

It is therefore an object of the present invention to provide an adaptive digital filter system allowing generation of a desired output signal without being affected by a high frequency signal if such an unnecessary high frequency signal is mixed into an input signal into an adaptive digital filter.

Another object of the present invention is to provide an adaptive digital filter for generating an output signal free of a signal component in an unnecessary frequency area.

Yet another object of the present invention is to suppress howling in an active noise control apparatus and to prevent precision degradation in high-order modes or in making data discrete by using an adaptive digital filter.

A digital filter system in accordance with the present invention includes a main adaptive digital filter unit in which its coefficient control portion controlling a coefficient sequence operates based on an LMS algorithm, and a sub adaptive digital filter unit connected to share the coefficient sequence with the main adaptive digital filter unit, and the sub adaptive digital filter unit has its output signal directly input into the coefficient control portion of the sub adaptive digital filter unit.

A sub input signal having a signal component in the same frequency band as that of a specified frequency signal desired to be removed from an output signal of the adaptive digital filter system is input into the sub adaptive digital filter unit. The sub input signal is converted by the FIR digital filter of the sub adaptive digital filter unit and becomes a sub output signal, and input into the coefficient control portion in the sub adaptive digital filter unit. As the sub output signal is input intact as an error signal at the coefficient control portion, a coefficient sequence in the FIR digital filter of the sub adaptive digital filter unit is updated so that the sub output signal is nullified. The coefficient sequence is the same one as that of the FIR digital filter in the main adaptive digital filter unit.

Meanwhile, the input signal input into the main adaptive digital filter unit is converted by the FIR digital filter of the main adaptive digital filter unit and output as an output signal of the adaptive digital filter. The output signal is compared to a desired signal to produce the error between them, the error is input into the coefficient control portion of the main adaptive digital filter unit as an error signal, the coefficient sequence is controlled and updated based on the LMS algorithm so that the error signal is nullified, and the output signal thus becomes the desired signal. At that time, the coefficient sequence is simultaneously updated and controlled to nullify a signal in the frequency band desired to be removed by the function of the sub adaptive digital filter unit as described above, the component of the frequency band is removed from the output signal. More specifically, the gain of the adaptive digital filter in the frequency band desired to be removed is restrained. Further, by controlling the ratio of the main adaptive digital filter unit side to the sub adaptive digital filter unit side in the number of shared coefficient sequence updating operations, a weighting in terms of probability is given to the effect of the coefficient sequence updating by the sub adaptive digital filter unit, and the degree of blocking the frequency band in the signal input into the sub adaptive digital filter unit is controlled.

For instance, in the characteristic of a coefficient sequence when an input signal to the sub adaptive digital filter unit is subjected to a weighting of high pass filtering type, the characteristic associated with the adaptive operation of the main adaptive digital filter unit is dominant in a low area which is a blocking area, while a high area which is a passing area is adjusted to block a signal of a high frequency by the effect of the adaptive operation of the sub digital filter unit.

The sub input signal may be generated by a dedicated independent circuit, or an external signal may appropriately be processed for use. An adaptive digital filter having the external signal input portion of its sub adaptive digital filter connected to a filter having a signal filtering characteristic to a prescribed frequency signal, through which filter an external signal is input into the sub adaptive digital filter unit is employed when an external signal is used, and the external signal is subjected to a weighting processing by the filter having a signal filtering characteristic to a prescribed frequency signal to be a sub input signal.

When an input signal into the main adaptive digital filter unit is used as an external signal, a signal having a frequency component within the input signal which adversely affects the operation of the main adaptive digital filter unit positively passes the filter and becomes the sub input signal.

When an output signal from the main adaptive digital filter unit is used, a signal having a frequency component in the output signal which adversely affects the operation of the main adaptive digital filter unit positively passes the filter, and becomes the sub input signal.

As described above, in the adaptive digital filter according to the present invention, limitations in terms of frequency characteristics is given on the frequency characteristic of a coefficient sequence as produced by a coefficient updating operation of a conventional adaptive digital filter by means of the adaptive operation of the sub adaptive digital filter unit.

An active noise control apparatus in accordance with the present invention, in another aspect, includes a duct having a noise source, a noise detector provided at the duct for detecting a noise signal, and a first adaptive digital filter outputting a signal having a frequency component which cancels the detected noise. The first adaptive digital filter has a coefficient sequence subjected to a convolution operation with the noise signal, and adjusts the coefficient sequence for outputting a signal canceling the detected noise as described above. The active noise control apparatus further includes a second adaptive digital filter sharing the above-stated coefficient sequence with the first adaptive digital filter for limiting the range of application of the first adaptive digital filter.

To a noise in the duct, the first adaptive digital filter outputs a frequency component canceling the noise, while the second adaptive digital filter limits the range of the filtering characteristic of the first adaptive digital filter to be applied. For example, when a weighting of a high-pass filtering type is conducted by the second adaptive digital filter, in the characteristic of the shared coefficient sequence the characteristic associated with the adaptive operation of the first adaptive digital filter is dominant in low frequency bands which form a blocking area, while high frequency bands which form a passing area are adjusted so that a signal of a high frequency is not passed by the function of the adaptive operation of the second adaptive digital filter. As a result, increase in gain can be prevented in a prescribed frequency area in the active noise control apparatus.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15(A) and 15(B) are representation for use in illustration of the principles of noise silencing and howling.

BRIEF DESCRIPTION OF THE PREFERRED EMBODIMENTS

(1) FIRST EMBODIMENT

Figure 1:
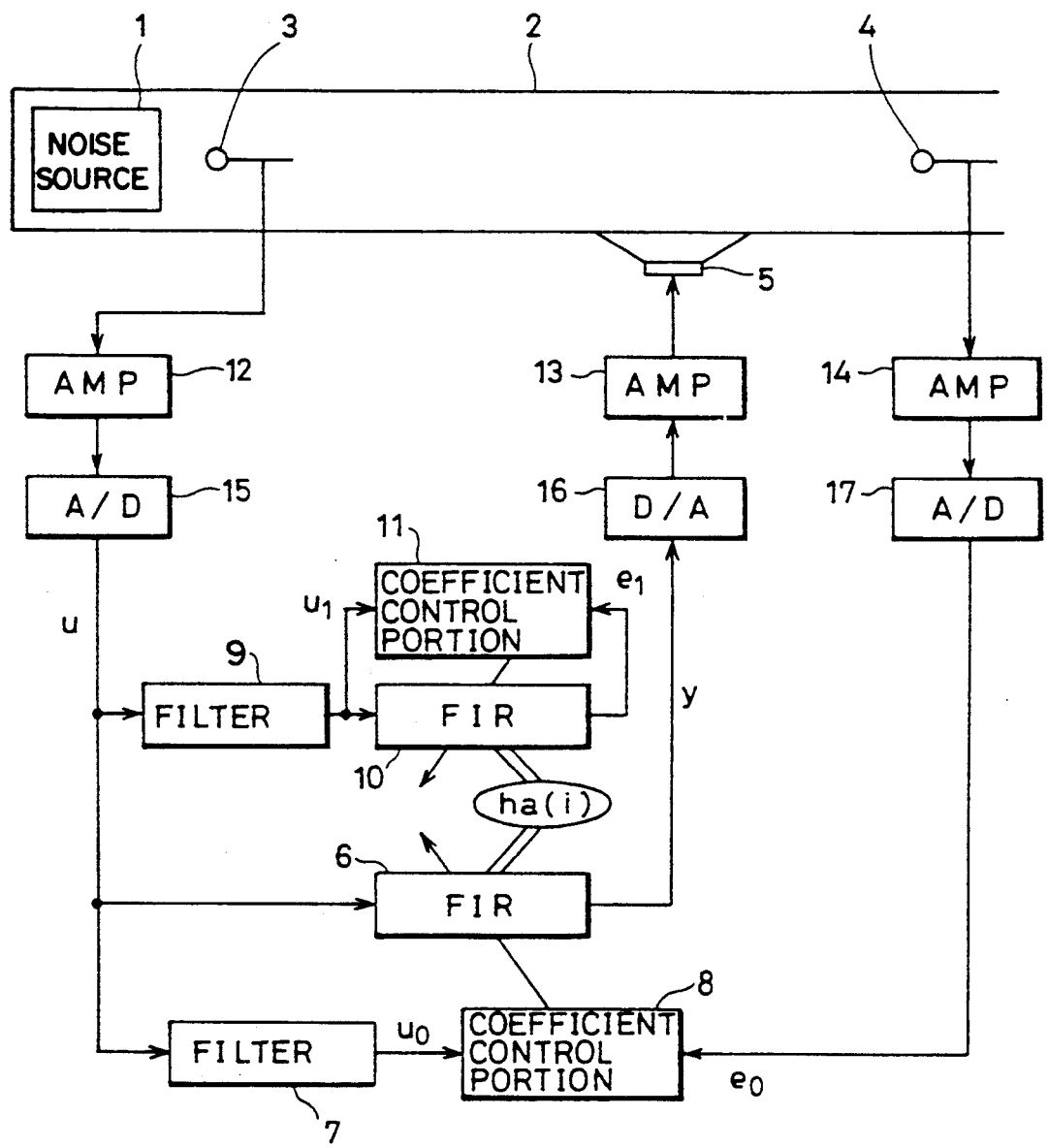
FIG. 1 is a schematic diagram showing an active noise cancellation apparatus in accordance with a first embodiment of the present invention.

FIG. 1 is a schematic diagram showing a construction of an adaptive digital filter in accordance with the present invention applied to an active noise cancellation apparatus. A noise source 1 is in a duct 2 having an opening at one end, and provided in duct 2 are a microphone for noise detection 3, a microphone for noise silencing error detection 4, and a speaker for noise silencing 5 as shown in the figure.

A control circuit using an adaptive digital filter is provided. The adaptive digital filter is formed of a sub adaptive digital filter unit constituted by an FIR digital filter 10 and a coefficient control portion 11 controlled based on an LMS algorithm, and a main adaptive digital filter unit constituted by an FIR digital filter 6 and a coefficient control portion 8 controlled based on an LMS algorithm. These two FIR digital filters 6 and 10 share a coefficient sequence ha (i). Further, a filter 9 is connected to the signal input portion FIR digital filter 10, while a digital filter 7 is connected to coefficient control portion 8.

A noise signal u (n) converted into a digital signal by an A/D converter 15 after detected at noise detection microphone 3 and transmitted through a preamplifier 12 is subjected to a convolution operation with a prescribed shared coefficient sequence ha (i) based on the following equation (4) in FIR digital filter. The result of the operation is output as a noise silencing signal y (n) to a D/A converter 16.

$$y(n) = \sum_{i=0}^{N-1} ha(i)u(n-i) \quad (4)$$

The noise silencing signal converted into an analog signal at D/A converter 16 is output through a power amplifier 13 to speaker for noise silencing 5. A sound wave from noise source 1 interferes with a sound wave from speaker for noise silencing 5, and the noise from noise source 1 is canceled by the effect. The result of the noise silencing is detected at microphone for noise silencing error detection 4, and the detected result is taken up into coefficient control portion 8 through a preamplifier 14, and an A/D converter 17 as a noise cancellation error signal $e_0$ (n). The shared coefficient sequence ha (i) is updated at coefficient control portion 8 to minimize the noise error signal. The equation for updating is the following equation (5).

$$ha(i,n+1) = ha(i,n) - \alpha_0 u_0(n-i) e_0(n) \quad (5)$$

where $\alpha_0$ is a convergence coefficient, and a small positive value.

$u_0$ (n) is a signal processed and output at digital filter 7 which corrects with a transfer characteristic from the output of FIR digital filter 6 to the output of the noise cancellation error signal by noise silencing error detection microphone 4, and the digital filter is inserted for the purpose of more accurate coefficient control.

Figure 2:
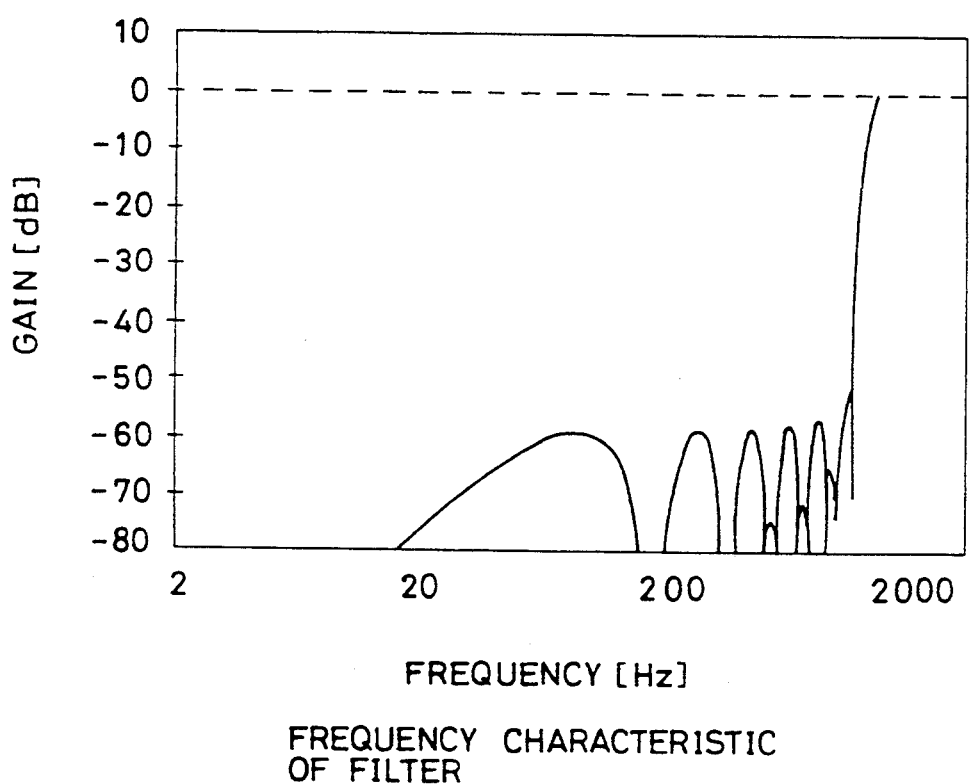
FIG. 2 is a graphic representation showing the frequency characteristic of a digital filter in accordance with the first embodiment.

Meanwhile, a noise signal u (n) is input into the digital filter 9, and the output $u_1$ (n) is input into FIR digital filter 10. Filter 9 is given a frequency characteristic of a high pass filtering type as shown in FIG. 2 in order to give the noise silencing signal y (n) such a limitation that a sound of a high frequency which cannot be controlled will not be output. The $u_1$ (n) is subjected to a convolution operation with the shared coefficient sequence ha (i) at FIR digital filter 10, the output $e_1$ (n) of which is output for input into coefficient control portion 11. Coefficient control portion 11 updates the coefficient sequence ha (i) based on the following equation (6). More specifically, the coefficient sequence ha (i) is thus controlled to be updated to nullify a high frequency signal input into FIR digital filter 10.

$$ha(i,n+1) = ha(i,n) - \alpha_1 u_1(n-i) e_1(n) \quad (6)$$

, where $\alpha_1$ is a convergence coefficient and takes a small positive value.

As digital filter 9 possesses a high passing characteristic, only an unnecessary high frequency component is input into the input of sub adaptive digital filter 10. The filter coefficient updating equation (6) on the side of sub adaptive digital filter 10 is to minimize the power of the output $e_1$ of the sub adaptive digital filter 10. Therefore, the frequency component which appears at the output of digital filter 9 will not appear at the output of sub adaptive digital filter 10. Naturally, such a high frequency does not appear at the output of main adaptive digital filter 6 having the same filtering coefficients.

Figure 3:
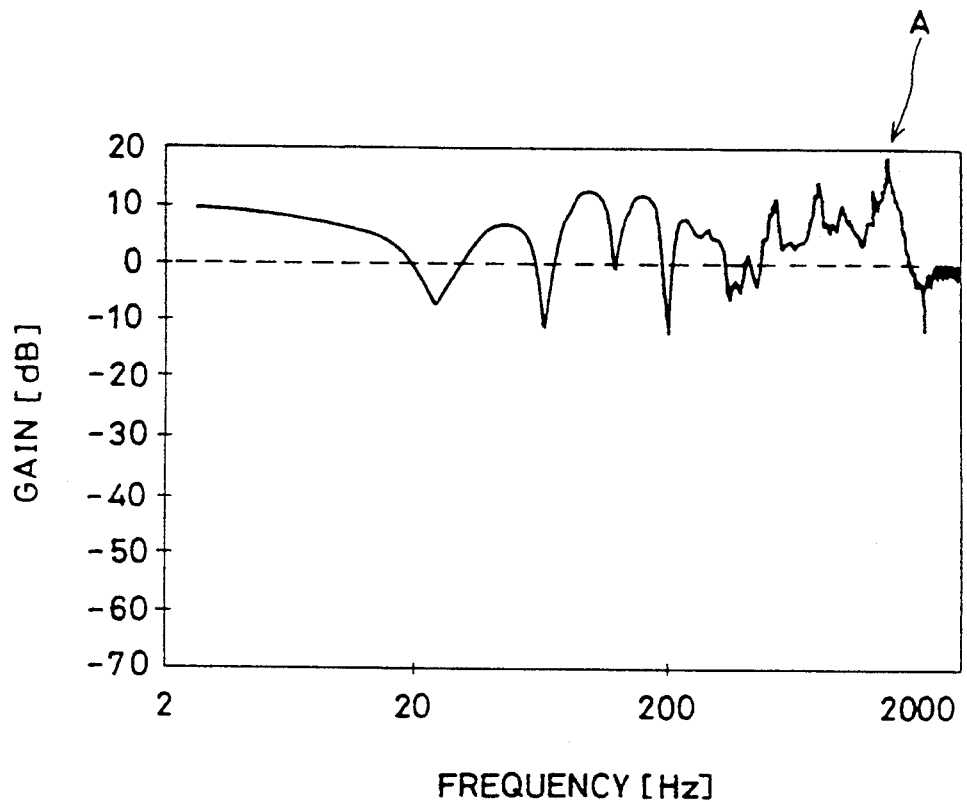
FIG. 3 is a graphic representation showing the frequency characteristic of a response of a main adaptive digital filter when a shared coefficient sequence updating operation is not conducted in a sub adaptive digital filter 10.

FIG. 3 shows the frequency characteristic of the gain of the adaptive digital filter based on the coefficient sequence ha (i) when a coefficient sequence updating operation is not conducted by the sub adaptive digital filter. This characteristic is produced by a calculation based on a Fourier transformation. An abnormal peak A is observed in a high frequency part, resulting in howling.

Figure 4C:
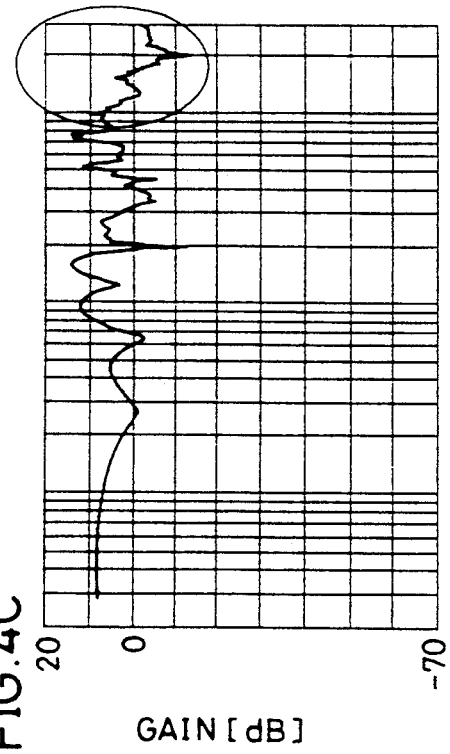
FIGS. 4A-4D are graphic representations showing the frequency characteristics of responses of the main adaptive digital filter when a shared coefficient sequence updating by a sub adaptive digital filter 10 is added.
Figure 4D:
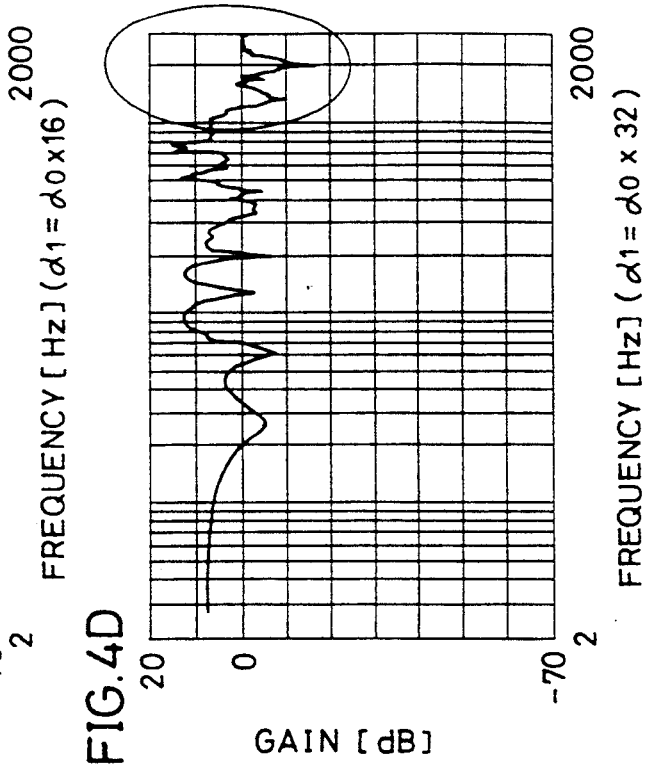
Figure 4A:
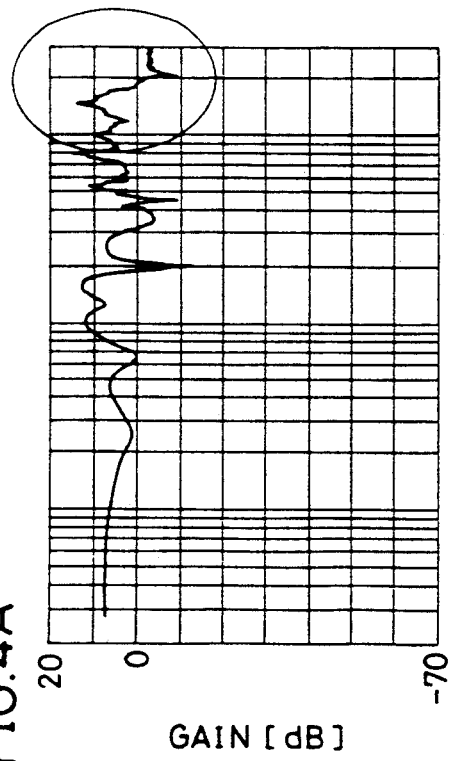
Figure 4B:
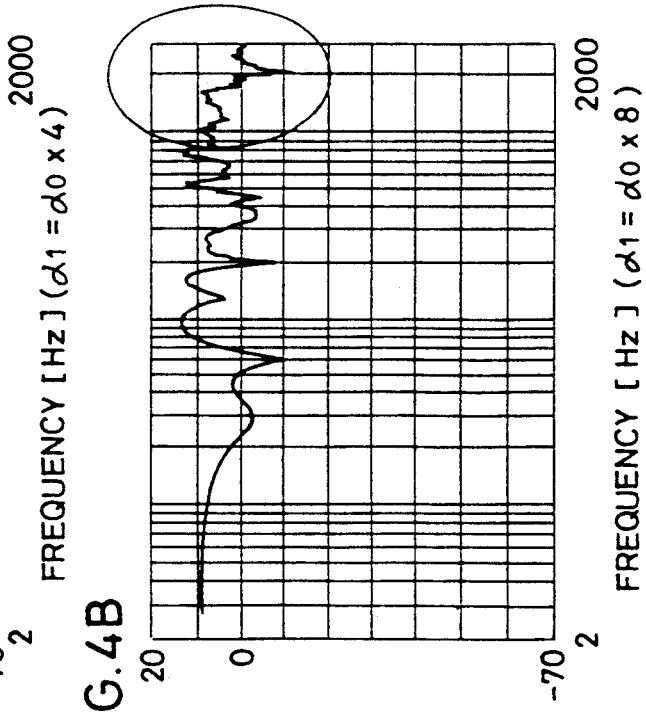

FIG. 4A shows the frequency characteristics of the gains of the adaptive digital filter based on the coefficient sequence ha (i) when a coefficient sequence updating is conducted by the sub adaptive digital filter. In this case, the abnormal peak observed in the case of FIG. 3 has disappeared, which reveals that stable control is enabled.

In the present embodiment, a white noise irrelevant to the noise signal u (n) and having its band limited may be used for the input $u_1$ (n) to the sub adaptive digital filter unit, and still the same effect is provided. An M sequence signal (a binary pseudo white noise), for example, may be used for the white noise.

By controlling the ratio of FIR digital filter 6 side and FIR digital filter 10 side in the number of coefficient sequence updating operations, the degree of the effects of the coefficient sequence updating by the sub adaptive digital filter unit can be adjusted. Further, if a convergence coefficient in the main adaptive digital filter unit is $a_0$, adjusting the ratio of $a_0$ to $a_1$ in size allows adjustment of the degree of the effects.

FIGS. 4A-4D are representations showing filter characteristics after adaptive operations are conducted. Referring to FIGS. 4A-4D, as the ratio of $a_1$ increases, the gain of a frequency encircled in the figure decreases, which shows the effect of restraining the gain by updating coefficients on the side of sub adaptive filter 10 increases. Therefore, by selecting the ratio $a_1$, properly, stable control is effected.

Figures 6A, 6B:
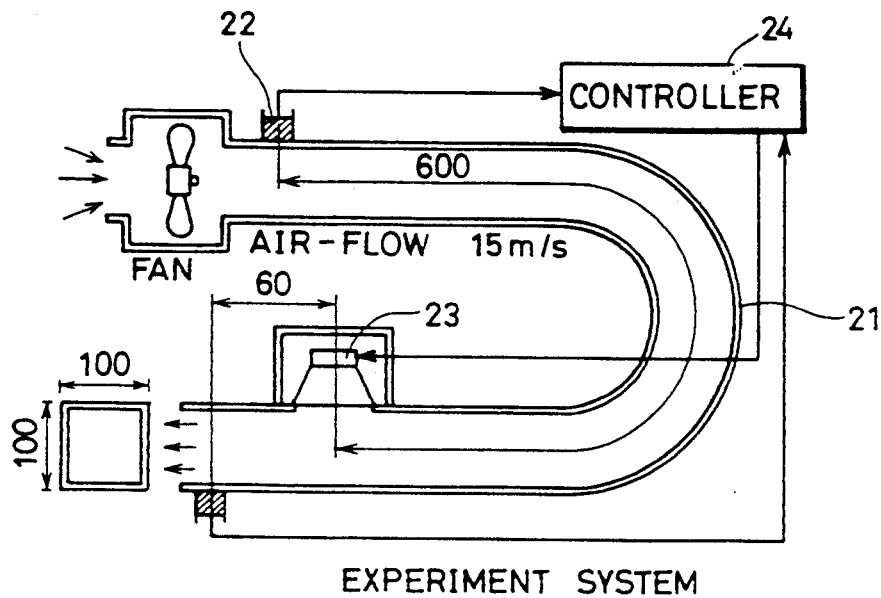
FIGS. 6A and 6B are a schematic diagram showing a specific construction of an apparatus which has obtained data, and a table showing the specification of a controller.

The data shown in FIGS. 4A-4D is produced in an experimental unit shown in FIG. 6A. An entire length of a duct 21 is 800 mm, and a duct cross section is $100 \times 100$ mm$^2$. An air current of about 15 m/s exists in duct 21. The distance between a sensor microphone 22 and a speaker for noise silencing 23 is 600 mm. The sensor microphone and a monitor microphone are provided on the internal wall of the duct with a piece of felt as thick as 2 mm therebetween, in order to prevent a noise from being generated by the air current. A controller 24 utilizes the construction shown in FIG. 1, and signal processing is conducted using a DSP (TMS320C25). The specification of controller 24 is given in FIG. 6B.

(2) SECOND EMBODIMENT

Figure 5:
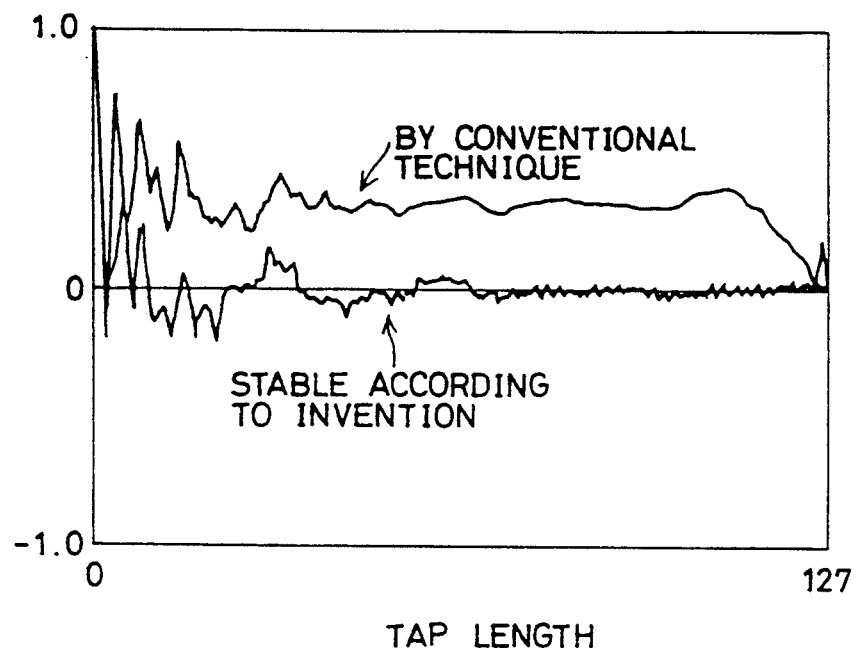
FIGS. 5(A) and 5(B) are graphic representation for use in illustration of the effect of a second embodiment.
Figure 5:
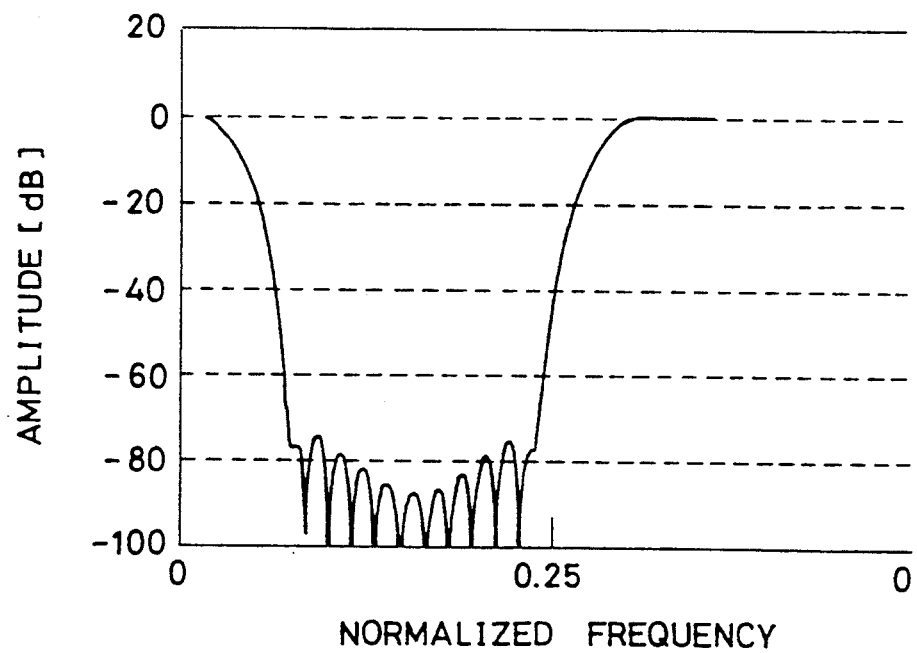

FIGS. 5(A) and 5(B) are representation for use in illustration of the effects when a blocking characteristic is provided to a specified band in digital filter 9. Using digital filter 9 having a characteristic as shown in FIG. 5(B), the gains of high frequencies and low frequencies can be suppressed. Conventionally, if, for example, an offsetting voltage error (D.C. component error) exists in A/D converting circuits 15 and 17, a filtering coefficient continues to increase as shown in FIG. 5(A) and diverges. However, according to the present invention, a filtering coefficient can stably be controlled without divergence.

(3) THIRD EMBODIMENT

Figure 7:
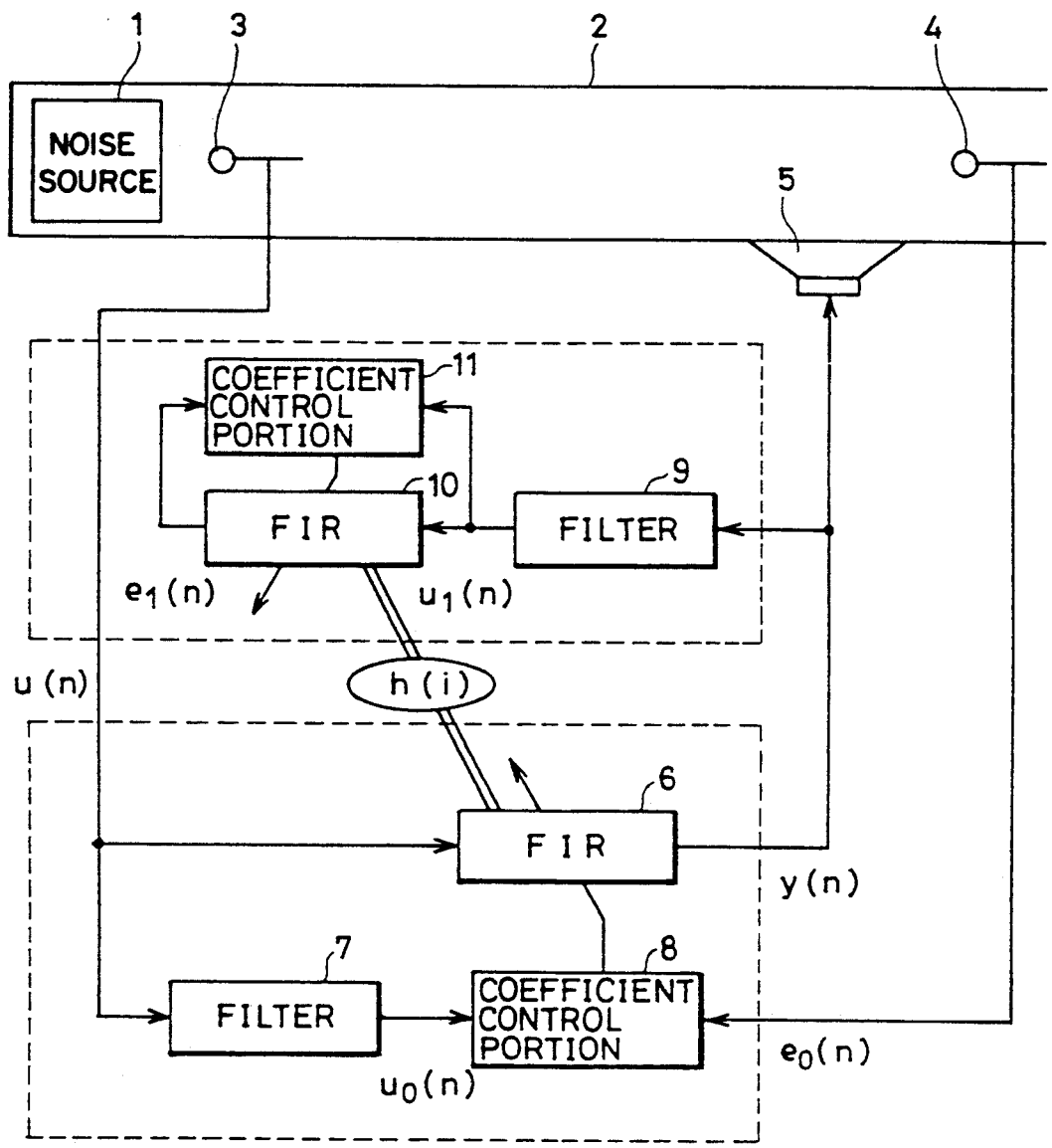
FIG. 7 is a schematic diagram showing an active noise cancellation apparatus in accordance with a third embodiment of the present invention.

FIG. 7 is a schematic diagram showing an application of an adaptive digital filter according to the present invention to an active noise cancellation apparatus. As compared to the first and second embodiments, a connection of a signal input portion to filter 9 is different, and the noise silencing signal y (n) is input into the filter 9 in the present embodiment.

Such connection of filter 9 allows coefficient control in the sub adaptive digital filter unit to be conducted based on the noise silencing signal y (n), and, therefore, an unnecessary high frequency component can be removed from the noise silencing signal y (n) more accurately as compared to the case of embodiment 1.

In any of the embodiments described above, the input signal to the adapted digital filter is input into filter 9, a desired high frequency output signal is provided, and the signal is input into FIR digital filter 10, but the desired high frequency output signal may be generated using an independent dedicated circuit. However, the circuit construction may be simplified by using an external signal in another part through a prescribed filter to produce a desired high frequency output signal. Furthermore, as in the case of the present embodiment, it is easier to remove unnecessary high frequency components when the input signal to the main adaptive digital filter unit or the output signal therefrom is used as an external signal.

Further, in the above-stated embodiments, gain restriction of the adaptive digital filter in the high frequency area has been described, but in the adaptive digital filter according to the present invention, if a signal having a component in a frequency band whose gain is desired to be restricted is used as an input signal to the sub adaptive digital filter unit, an adaptive digital filter is provided having a small gain in the frequency band whose gain is desired to be restricted. Accordingly, selection of an input signal to the sub adaptive digital filter unit permits an adaptive digital filter having various gain characteristics to be constructed. In this case, if a signal into the sub adaptive digital filter unit is provided through a filter, the frequency filtering characteristic of the filter can conveniently be selected to easily change the gain characteristic of the adaptive digital filter.

Figure 8:
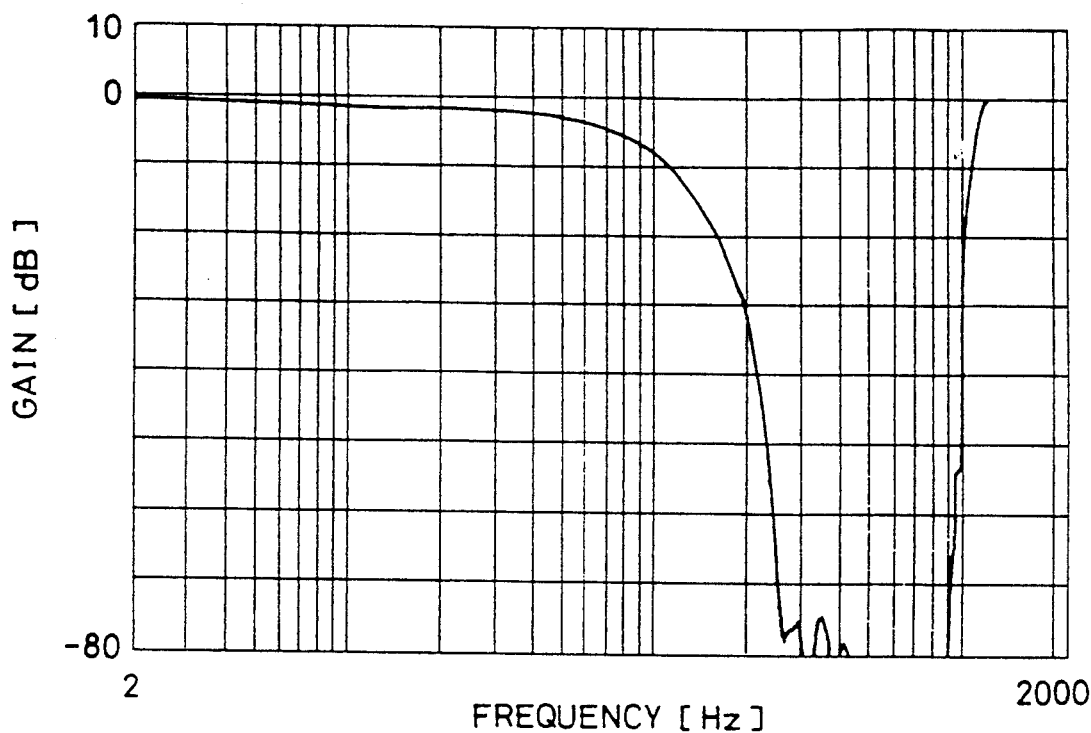
FIG. 8 is a representation showing one example of the frequency characteristic of a digital filter 9.

As an example, if a filter having a band blocking characteristic as shown in FIG. 8 is used, gains in the high frequency band and the low frequency band are both restricted at a time, a DC gain increase can be restricted together with howling in the high frequencies, and, therefore, an adaptive digital filter is achieved allowing restriction of the DC gain due to an offsetting error by an A/D converter.

Figure 9A:
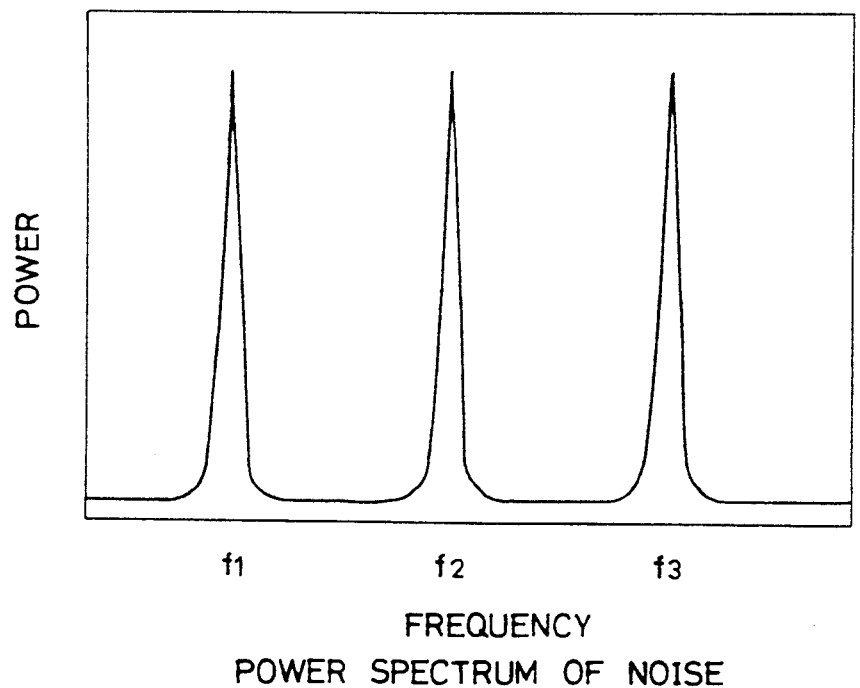
FIG. 9A and 9B are representations showing the power spectrum of a noise and a frequency characteristic of the filter.
Figure 9B:
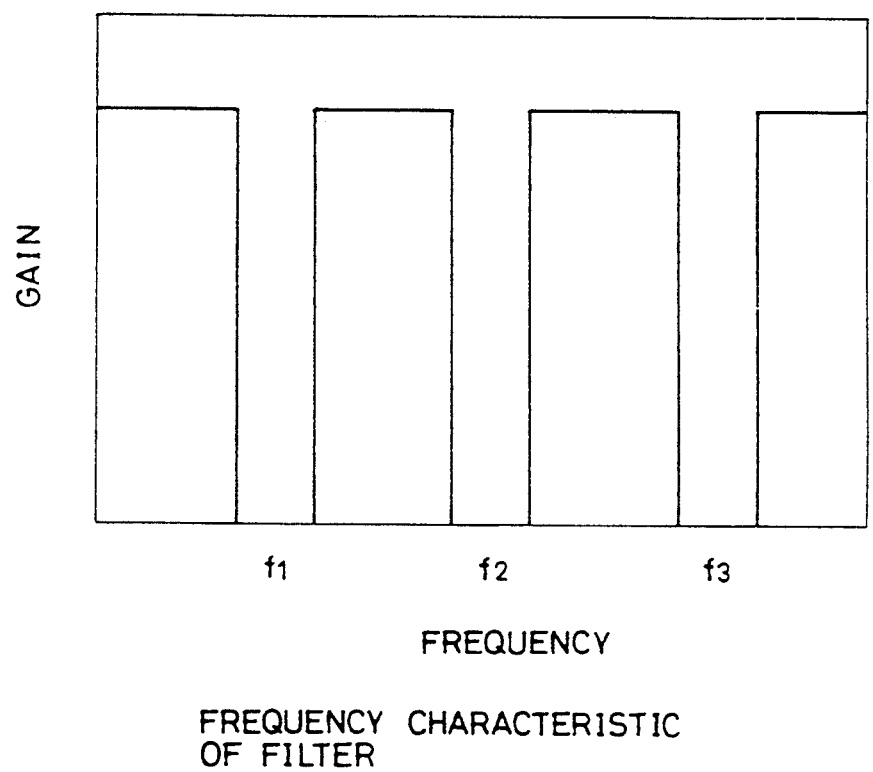
Figure 10:
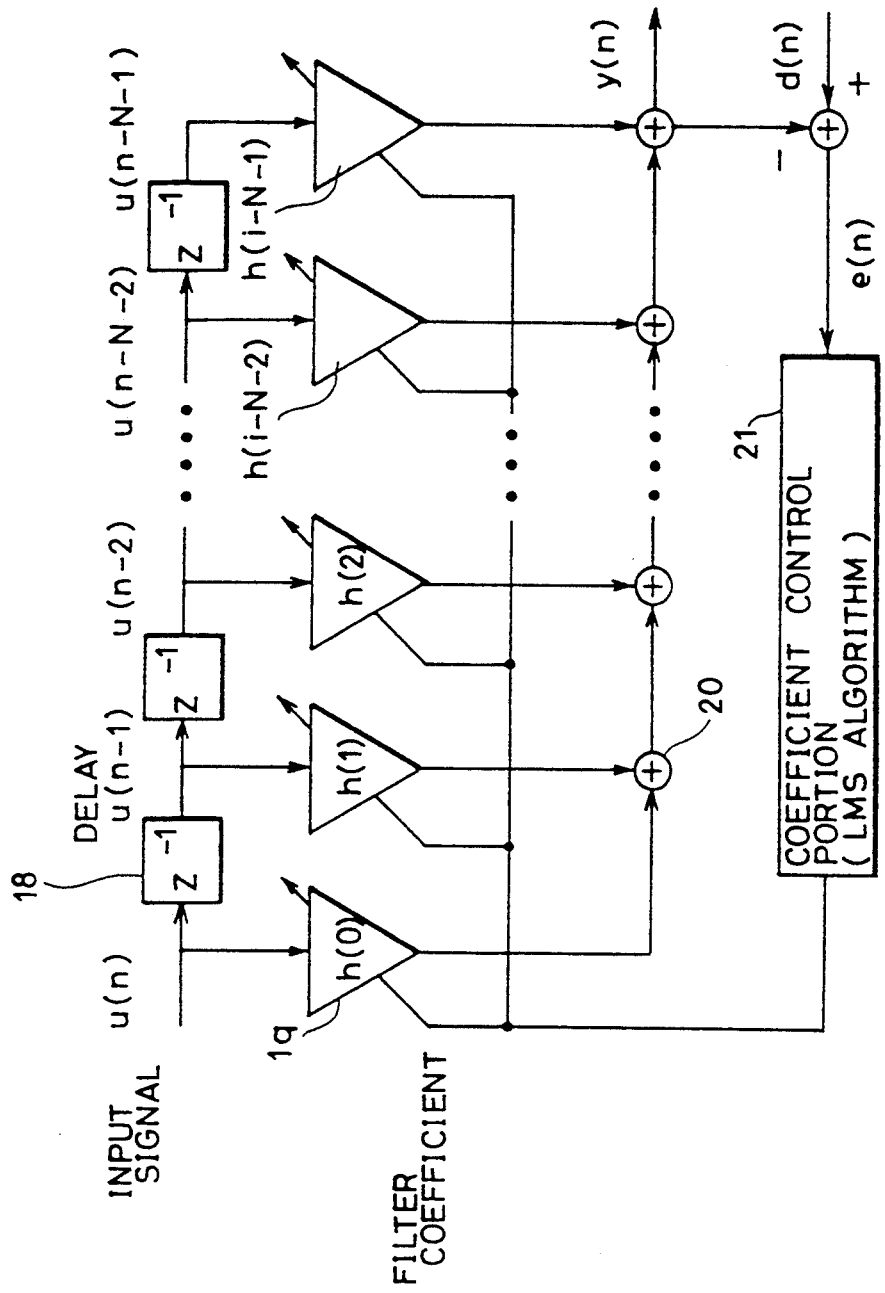
FIG. 10 is a diagram showing a construction of a conventional adaptive digital filter.
Figure 11:
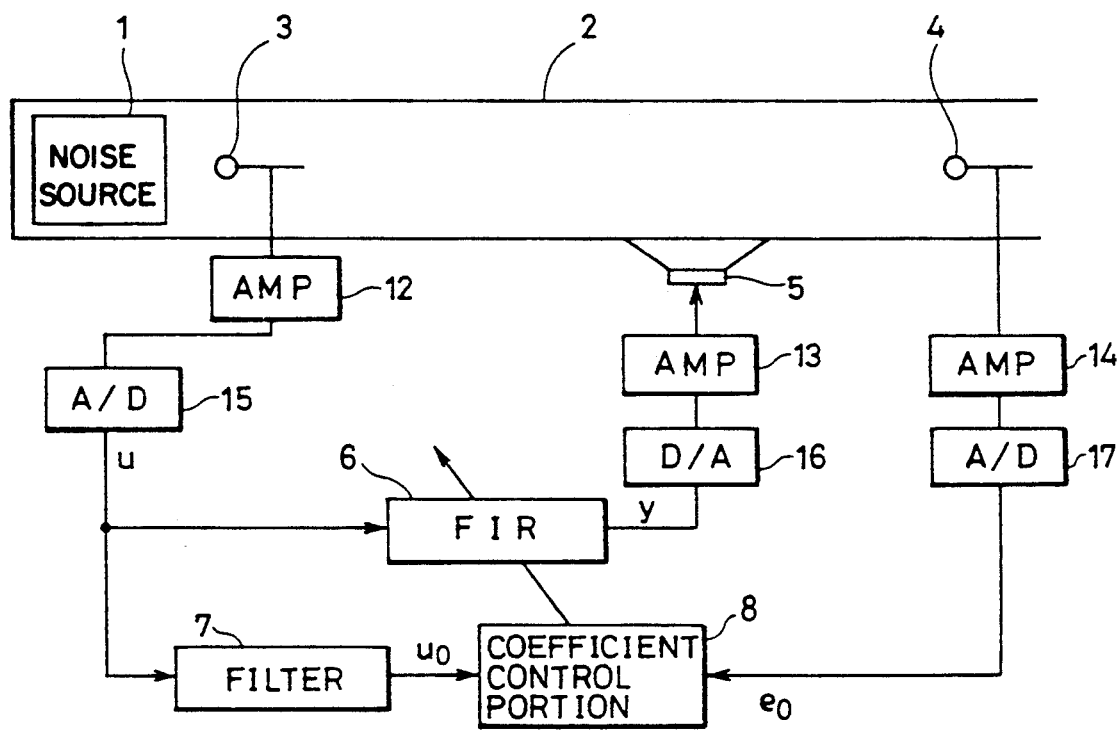
FIG. 11 is a schematic diagram showing a construction of an active noise cancellation apparatus to which a conventional adaptive digital filter is applied.
Figure 12:
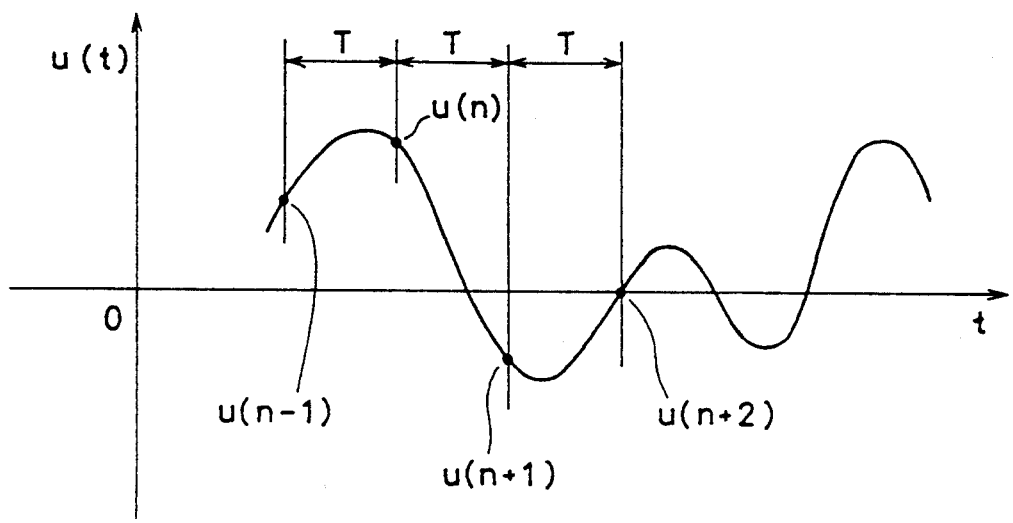
FIG. 12 is a graphic representation showing a sampling frequency.
Figure 13:
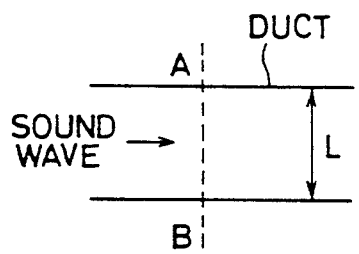
FIGS. 13(a) to 13(d) are a graphic representation showing a sound pressure propagation mode.
Figure 13:
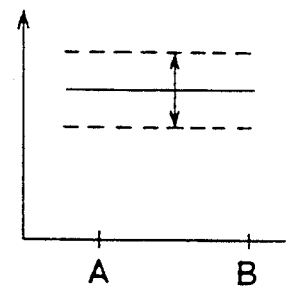
Figure 13:
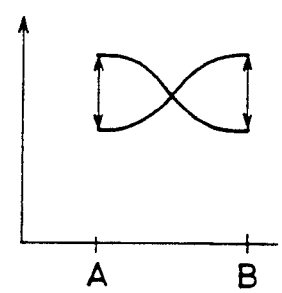
Figure 13:
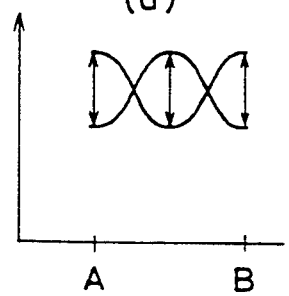
Figure 14:
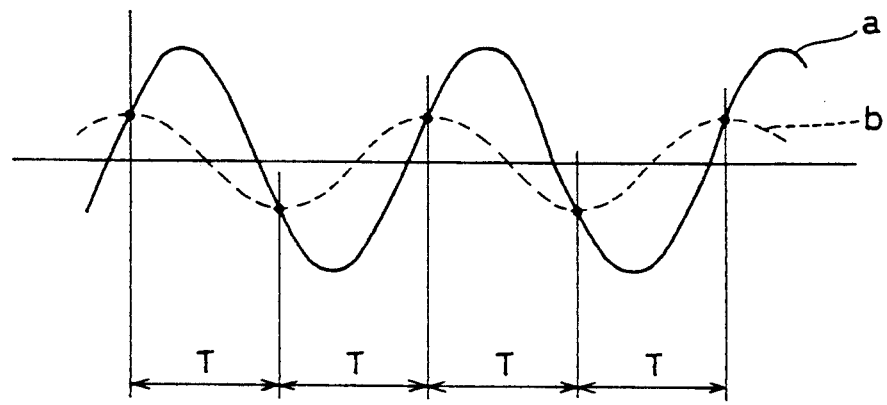
FIG. 14 includes graphic representations for use in illustration of errors generated by making data discrete.
Figure 14:
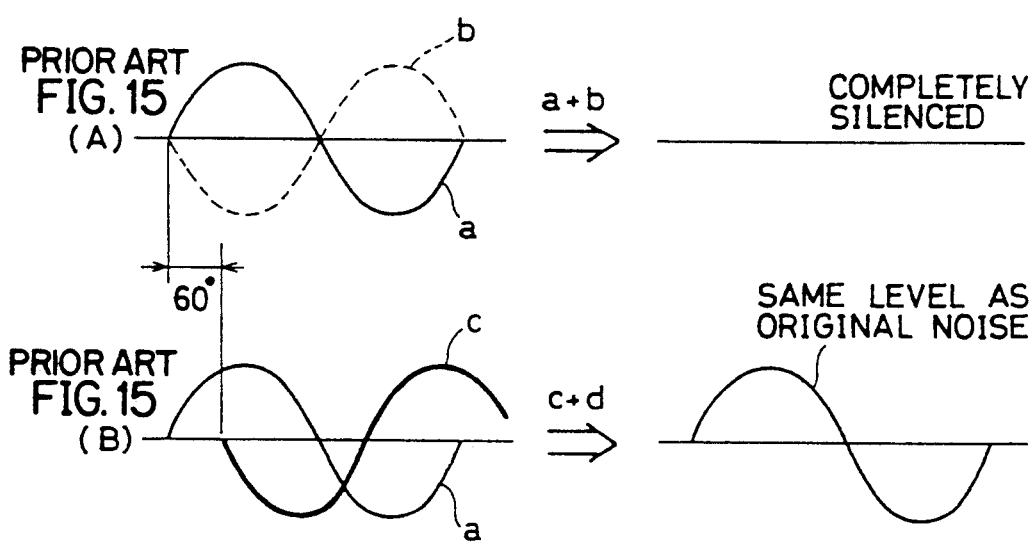

In the case of the above-stated embodiment, if the band of a frequency component of a noise to be controlled is limited as shown in FIG. 9A, the frequency characteristic of filter 9 is set to be a band filtering characteristic as shown in FIG. 9B, an adaptive digital filter directed to improvement of stability against disturbance other than the frequency of a noise, thus providing a stable active noise control apparatus.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An adaptive digital filter system, comprising:

first adaptive digital filter means including a first finite impulse response (FIR) digital filter, and a first coefficient control portion for controlling a coefficient sequence to change the operation characteristic of said first FIR digital filter, said coefficient control portion being operated based on an algorithm by which a value is minimized relating to the difference between an output signal from the first FIR digital filter and a desired value; and second adaptive digital filter means connected to said first adaptive digital filter means sharing said coefficient sequence and including a second FIR digital filter, and a second coefficient control portion controlling said coefficient sequence by which said second FIR digital filter is operated, wherein said first and second adaptive digital filter means each outputs, as an output signal a result of a convolution operation of an input signal sequence and said coefficient sequence, respectively, and said output signal of said second adaptive digital filter means is input into said second coefficient control portion.

2. An adaptive digital filter system as recited in claim 1, further comprising a filter connected to a preceding stage to said second adaptive digital filter means and having a signal filtering characteristic to a signal of a prescribed frequency, a signal passing said filter being input as said input signal to said second adaptive digital filter means.

3. An adaptive digital filter system as recited in claim 2, wherein said first adaptive digital filter means and said second adaptive digital filter means are connected so that said input signal to said first adaptive digital filter means is input to said second adaptive digital filter means through said filter.

4. An adaptive digital filter system as recited in claim 2, wherein said first adaptive digital filter means and said second adaptive digital filter means are connected so that said output signal from said first adaptive digital filter means is input to said second adaptive digital filter means through said filter.

5. An adaptive digital filter system as recited in claim 1, wherein said input signal is sampled at a predetermined period and said coefficient sequence is updated at the timing of the sampling.

6. An adaptive digital filter system as recited in claim 1, wherein said input signal is sampled at a predetermined period and said coefficient sequence is updated at the timing of the predetermined number of the sampling.

7. An active noise control apparatus, comprising:

input signal detection means for detecting a first input signal;

an output signal outputting means responsive to an output signal for outputting a noise cancellation signal;

error detection means for detecting an error which is the difference between said output signal and a desired signal;

a first adaptive digital filter means for conducting a convolution operation of said first input signal and a prescribed coefficient sequence and outputting said output signal;

coefficient changing means for changing said coefficient sequence subjected to the convolution operation with said input signal to minimize said error;

second adaptive digital filter means for conducting a convolution operation of a second input signal having a specified frequency band component and said changed coefficient sequence and outputting a second output signal; and second coefficient changing means responsive to the second output signal for once again changing said changed coefficient sequence to minimize said second output signal.

8. An active noise control apparatus as recited in claim 7 wherein said second adaptive digital filter means includes a filter for preparing said second input signal from said first input signal.

9. An active noise control apparatus as recited in claim 7, wherein said second adaptive digital filter means includes a filter for preparing said second input signal from said output signal.

10. An active noise control apparatus, comprising:

a duct having a noise source;

noise detection means provided near said duct for detecting a noise signal from said duct;

first adaptive digital filter means having a prescribed filter coefficient sequence for inputting said noise signal and updating said filter coefficient sequence to output noise cancellation a signal having a frequency component canceling the noise; and second adaptive digital filter means sharing said filter coefficient sequence with said first adaptive digital filter means and responsive to said noise cancellation signal for limiting to the range of adaptation of a filter characteristic adjusted in said first adaptive digital filter means.

* * * * *